(12) United States Patent
Shim et al.

(10) Patent No.: US 6,600,431 B1
(45) Date of Patent: Jul. 29, 2003

(54) DATA MODULATION AND CORRECTION METHODS FOR USE WITH DATA WRITTEN TO AND READ FROM RECORDING MEDIA

(75) Inventors: Jae-seong Shim, Seoul (KR); Kyung-geun Lee, Gyeonggi-do (KR); Ki-hyun Kim, Seoul (KR); Hyun-soo Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/973,940

(22) Filed: Oct. 11, 2001

(30) Foreign Application Priority Data

Oct. 11, 2000 (KR) .......................................... 2000-59840

(51) Int. Cl.$^7$ ............................................... H03M 7/00
(52) U.S. Cl. ................... 341/59; 341/58; 369/47.19; 369/30.1; 714/795; 714/769; 375/368; 375/376
(58) Field of Search ..................... 369/30.1, 59.22, 369/47.19, 44.39; 341/59, 58; 714/795, 769; 375/376, 368

(56) References Cited

U.S. PATENT DOCUMENTS

| | | | | |
|---|---|---|---|---|
| 5,451,943 A | * | 9/1995 | Satomura | 341/58 |
| 5,600,315 A | * | 2/1997 | Shimpuku et al. | 341/59 |
| 5,703,580 A | * | 12/1997 | Ko | 341/59 |
| 5,767,798 A | * | 6/1998 | Won | 341/59 |
| 6,188,336 B1 | * | 2/2001 | Kim | 341/59 |
| 6,246,346 B1 | * | 6/2001 | Cloke et al. | 341/59 |
| 6,281,815 B1 | * | 8/2001 | Shim et al. | 341/59 |
| 6,441,756 B1 | * | 8/2002 | Shim | 341/59 |

* cited by examiner

*Primary Examiner*—Michael Tokar
*Assistant Examiner*—Lam T. Mai
(74) *Attorney, Agent, or Firm*—Staas & Halsey LLP

(57) ABSTRACT

A data modulation method resistant to channel distortion and a method of correcting error in data coded by the modulation method. The data modulation method uses a run length limited (RLL) modulation code applied to write data to an optical storage medium, the RLL modulation code being expressed as RLL (d, k, m, n, s) with s=2 or greater, where d is minimum run length, k is maximum run length, m is a data bit length before modulation, n is a codeword bit length after modulation, and s is a space length between codewords. Further, the data modulation method provides run lengths expressed as $i_{n+1}=i_n+s$ (n=1, 2, . . . ), where $i_1=d$.

26 Claims, 12 Drawing Sheets

FIG. 1
(PRIOR ART)
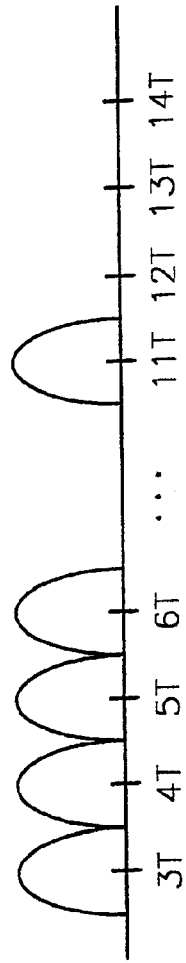
FIG. 2
(PRIOR ART)
| SEGMENT | VFO1 | AM | PID1 | IED1 | PA1 | VFO2 | AM | PID2 | IED2 | PA2 |
|---|---|---|---|---|---|---|---|---|---|---|
| BYTES | 36 | 3 | 4 | 2 | 1 | 8 | 3 | 4 | 2 | 1 |
| BITS | 576 | 48 | 54 | 32 | 16 | 128 | 48 | 54 | 32 | 16 |
| BITS IN TOTAL | 1004 | | | | | | | | | |
FIG. 3
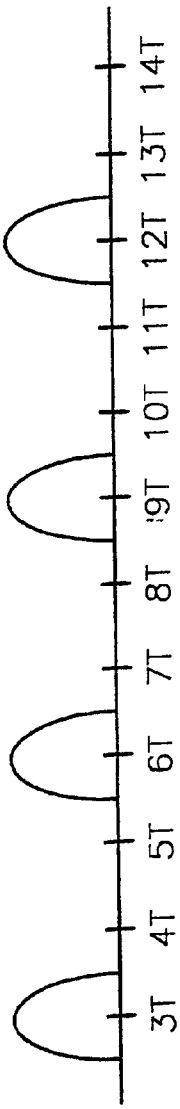

FIG. 4

| CDS | CODEWORDS |
|---|---|
| 1 | 53 |
| −1 | 0 |
| 3 | 48 |
| −3 | 50 |
| 5 | 0 |
| −5 | 41 |
| 7 | 33 |
| −7 | 0 |
| 9 | 19 |
| −9 | 25 |
| 11 | 0 |
| −11 | 12 |
| 13 | 7 |
| −13 | 0 |
| 15 | 2 |
| −15 | 3 |
| TOTAL | 293 |

FIG. 5A

| DATA | CODEWORD | DATA | CODEWORD |
|------|----------|------|----------|
| 000 | 00000001000000010000000010 | 064 | 00001000001001001000010010 |
| 001 | 00000001000000010000010000 | 065 | 00001000001001001001000010 |
| 002 | 00000001000000010000010010 | 066 | 00001000001001001001010000 |
| 003 | 00000001000000010010000010 | 067 | 00001000001001001001010010 |
| 004 | 00000001000000010010010000 | 068 | 00001001000000010000000010 |
| 005 | 00000001000000010010010010 | 069 | 00001001000000010000010000 |
| 006 | 00000001000001000000010000 | 070 | 00001001000000010000010010 |
| 007 | 00000001000001000000010010 | 071 | 00001001000000010010000010 |
| 008 | 00000001000010000010000010 | 072 | 00001001000000010010010000 |
| 009 | 00000001000010000010010000 | 073 | 00001001000000010010010010 |
| 010 | 00000001000010000010010010 | 074 | 00001001000001000000010000 |
| 011 | 00000001000010010000000010 | 075 | 00001001000001000000010010 |
| 012 | 00000001000010010010000010 | 076 | 00001001000010000010000000 |
| 013 | 00000001000010010000010010 | 077 | 00001001000010000010010000 |
| 014 | 00000001000010010010000010 | 078 | 00001001000010010000000010 |
| 015 | 00000001000010010010010000 | 079 | 00001001000010000010010010 |
| 016 | 00000001000010010010010010 | 080 | 00001001000010010010000010 |
| 017 | 00000001001000000010000010 | 081 | 00001001000010010010010000 |
| 018 | 00000001001000000010010000 | 082 | 00001001000010010010010010 |
| 019 | 00000001001000000010010010 | 083 | 00001001000010010010010010 |
| 020 | 00000001001000010000000010 | 084 | 00001001001000000010000010 |
| 021 | 00000001001000010000010000 | 085 | 00001001001000000010010000 |
| 022 | 00000001001000010000010010 | 086 | 00001001001000000010010010 |
| 023 | 00000001001000010010000010 | 087 | 00001001001000010000000010 |
| 024 | 00000001001000010010010000 | 088 | 00001001001000010000010000 |
| 025 | 00000001001000010010010010 | 089 | 00001001001000010000010010 |
| 026 | 00000001001001000000010000 | 090 | 00001001001000010010000010 |
| 027 | 00000001001001000000010010 | 091 | 00001001001000010010000010 |
| 028 | 00000001001001000010010010 | 092 | 00001001001000010010010000 |
| 029 | 00000001001001000010010000 | 093 | 00001001001000010010010010 |
| 030 | 00000001001001000010010010 | 094 | 00001001001001000000010000 |
| 031 | 00000001001001010000000010 | 095 | 00001001001001000000010010 |
| 032 | 00000001001001010000010000 | 096 | 00001001001001000010000010 |
| 033 | 00000001001001010000010010 | 097 | 00001001001001000010010000 |
| 034 | 00000001001001010010000010 | 098 | 00001001001001000010010010 |
| 035 | 00000001001001010010010000 | 099 | 00001001001001010000000010 |
| 036 | 00000001001001010010010010 | 100 | 00001001001001010000010000 |
| 037 | 00001000000001000000010000 | 101 | 00001001001001010000010010 |
| 038 | 00001000000001000000010010 | 102 | 00001001001001010010000010 |
| 039 | 00001000000001000001010000 | 103 | 00001001001001010010010000 |
| 040 | 00001000000001000001010010 | 104 | 00001001001001010010010010 |
| 041 | 00001000000001001000000010 | 105 | 01000000001000000010000010 |
| 042 | 00001000000001001000010000 | 106 | 01000000001000000010010000 |
| 043 | 00001000000001001000010010 | 107 | 01000000001000000010010010 |
| 044 | 00001000000001001010000010 | 108 | 01000000001000010000000010 |
| 045 | 00001000000001001010010000 | 109 | 01000000001000010000010000 |
| 046 | 00001000000001001010010000 | 110 | 01000000001000010000010010 |
| 047 | 00001000000001001010010010 | 111 | 01000000001000010010000010 |
| 048 | 00001000001000000010000010 | 112 | 01000000001000010010010000 |
| 049 | 00001000001000000010010000 | 113 | 01000000001000010010010010 |
| 050 | 00001000001000000010010010 | 114 | 01000000001001000000010000 |
| 051 | 00001000001000010000000010 | 115 | 01000000001001000000010010 |
| 052 | 00001000001000010000010000 | 116 | 01000000001001000010000010 |
| 053 | 00001000001000010000010010 | 117 | 01000000001001000010010000 |
| 054 | 00001000001000010010000010 | 118 | 01000000001001000010010010 |
| 055 | 00001000001000010010010000 | 119 | 01000000001001010000000010 |
| 056 | 00001000001000010010010010 | 120 | 01000000001001010000010000 |
| 057 | 00001000001001000000010000 | 121 | 01000000001001010000010010 |
| 058 | 00001000001001000000010010 | 122 | 01000000001001010010000010 |
| 059 | 00001000001001000010000010 | 123 | 01000000001001010010010000 |
| 060 | 00001000001001000010010000 | 124 | 01000000001001010010010010 |
| 061 | 00001000001001000010010010 | 125 | 01000001000000010000000010 |
| 062 | 00001000001001001000000010 | 126 | 01000001000000010000010000 |
| 063 | 00001000001001001000010000 | 127 | 01000001000000010000010010 |

FIG. 5B

| DATA | CODEWORD | DATA | CODEWORD |
|---|---|---|---|
| 128 | 01000001000000000010010000010 | 192 | 0100100000100100100010010 |
| 129 | 01000001000000000010010010000 | 193 | 01001001000000000010000000010 |
| 130 | 01000001000000000010010010010 | 194 | 01001001000000000100000010000 |
| 131 | 01000001000001000000000010000 | 195 | 01001001000000000100000010010 |
| 132 | 01000001000001000000000010010 | 196 | 01001001000000000010010000010 |
| 133 | 01000001000001000000010000010 | 197 | 01001001000000000010010010000 |
| 134 | 01000001000001000000010010000 | 198 | 01001001000000000010010010010 |
| 135 | 01000001000001000000010010010 | 199 | 01001001000001000000000010000 |
| 136 | 01000001000001001000000000010 | 200 | 01001001000001000000000010010 |
| 137 | 01000001000001001000000010000 | 201 | 01001001000001000000010000010 |
| 138 | 01000001000001001000000010010 | 202 | 01001001000001000000010010000 |
| 139 | 01000001000001001001000000010 | 203 | 01001001000001000000010010010 |
| 140 | 01000001000001001001001010000 | 204 | 01001001000001001001000000010 |
| 141 | 01000001000001001001001010010 | 205 | 01001001000001001000000010000 |
| 142 | 01000001001000000000010000010 | 206 | 01001001000001001000000010010 |
| 143 | 01000001001000000000010010000 | 207 | 01001001000001001001000000010 |
| 144 | 01000001001000000000010010010 | 208 | 01001001000001001001000010000 |
| 145 | 01000001001000010000000010 | 209 | 01001001000001001001000010010 |
| 146 | 01000001001000010000010000 | 210 | 01001001001000000000010000010 |
| 147 | 01000001001000010000010010 | 211 | 01001001001000000000010010000 |
| 148 | 01000001001000010010000010 | 212 | 01001001001000000000010010010 |
| 149 | 01000001001000010010010000 | 213 | 01001001001000010000000010 |
| 150 | 01000001001000010010010010 | 214 | 01001001001000010000010000 |
| 151 | 01000001001001000000010000 | 215 | 01001001001000010000010010 |
| 152 | 01000001001001000000000010010 | 216 | 01001001001000010010000010 |
| 153 | 01000001001001000000010000010 | 217 | 01001001001000010010010000 |
| 154 | 01000001001001000000010010000 | 218 | 01001001001001000000000010 |
| 155 | 01000001001001000000010010010 | 219 | 01001001001001000000010010 |
| 156 | 01000001001001001000000010 | 220 | 01001001001001000000100000010 |
| 157 | 01000001001001001000010000 | 221 | 01001001001001000000100010000 |
| 158 | 01000001001001001000010010 | 222 | 01001001001001000000100010010 |
| 159 | 01000001001001001001010000 | 223 | 01001001001001000000100010010 |
| 160 | 01000001001001001001010010 | 224 | 01001001001001001000010000 |
| 161 | 01000001001001001001001010 | 225 | 01001001001001001001010010 |
| 162 | 01001000000001000000000010000 | 226 | 01001001001001001001010010 |
| 163 | 01001000000001000000000010010 | 227 | 01001001001001001001010010 |
| 164 | 01001000000001000000010000 | 228 | 01001001001001001001010000 |
| 165 | 01001000000001000000010010000 | 229 | 01001001001001001001010010 |
| 166 | 01001000000001000000010010010 | 230 | 00000001000000000000100000010 |
| 167 | 01001000000001001000000010 | 231 | 00000001000000000000100010010 |
| 168 | 01001000000001001000000010000 | 232 | 00000001000000000000100010010 |
| 169 | 01001000000001001000000010010 | 233 | 00000001000001000000000010 |
| 170 | 01001000000001001001000000010 | 234 | 00000001001000000000010000 |
| 171 | 01001000000001001001000010000 | 235 | 00000001001000000000010010 |
| 172 | 01001000000001001001000010010 | 236 | 00001000000000000010000010 |
| 173 | 01001000001000000000010000 | 237 | 00001000000000000100000010 |
| 174 | 01001000001000000000010000 | 238 | 00001000000000000100000010010 |
| 175 | 01001000001000000000010010010 | 239 | 00001000000000000100010010 |
| 176 | 01001000001000010000000010 | 240 | 00001000000000000100010000 |
| 177 | 01001000001000010000010000 | 241 | 00001000000000000100010010010 |
| 178 | 01001000001000010000010010 | 242 | 00001000000001000000000010 |
| 179 | 01001000001000010010000010 | 243 | 00001000000001000000010000 |
| 180 | 01001000001000010010010000 | 244 | 00001000000001000000010010 |
| 181 | 01001000001000010010010010 | 245 | 00001000000100000000000010 |
| 182 | 01001000001001000000000010 | 246 | 00001000100000000000010000 |
| 183 | 01001000001001000000010010 | 247 | 00001000100000000000010000 |
| 184 | 01001000001001000000100010 | 248 | 00001001000000000000010000 |
| 185 | 01001000001001000010010000 | 249 | 00001001000000000000010010 |
| 186 | 01001000001001000010010010 | 250 | 00001001000010000000000010 |
| 187 | 01001000001001001000000010 | 251 | 00001001001000000000010000 |
| 188 | 01001000001001001001010000 | 252 | 00001001001000000000010010 |
| 189 | 01001000001001001001010010 | 253 | 00001001001001000000000010 |
| 190 | 01001000001001001001001010 | 254 | 01000000000001000000000010 |
| 191 | 01001000001001001001001010000 | 255 | 01000000000001000000000010010 |

FIG. 6A

| DATA | CODEWORD | DATA | CODEWORD |
|---|---|---|---|
| 000 | 00000001000000000010000010 | 064 | 00000001001001000010010010 |
| 001 | 00000001000000000010000010000 | 065 | 00000001001001001001000010 |
| 002 | 00000001000000000010010010 | 066 | 00001000000000000100000010010 |
| 003 | 00000001000001001000000010010 | 067 | 00001000000000000100100010000 |
| 004 | 00000001000001001001001000000 | 068 | 00001000000000100000000010010 |
| 005 | 00000001001001000000010010 | 069 | 00001000000000100000010000010 |
| 006 | 00000001001001000010010000 | 070 | 00001000000000100000010010000 |
| 007 | 00001000000000000010000000010 | 071 | 00001000000000100100000010000 |
| 008 | 00001000000001000000000010000 | 072 | 00001000000000100100010010010 |
| 009 | 00001000000001000000010010 | 073 | 00001000001000000000010000010 |
| 010 | 00001000000001001001000010000 | 074 | 00001000001000001000000000010 |
| 011 | 00001000000100000010000010010 | 075 | 00001000001000001001001000 |
| 012 | 00001000000100001001001000000 | 076 | 00001000001000001010010010 |
| 013 | 00001000000100100000010000010 | 077 | 00001000001001000000010000 |
| 014 | 00001000000100100001000010000 | 078 | 00001000001001000010010010 |
| 015 | 00001000000100100010010010 | 079 | 00001000001001001000010010 |
| 016 | 00001001000001000000010010 | 080 | 00001000001001001001010000010 |
| 017 | 00001001000001000010010000 | 081 | 00001000001001001010010010 |
| 018 | 00001001001000000010000010 | 082 | 00001001000000010000000010 |
| 019 | 00001001001000001000010000 | 083 | 00001001000001000000000010 |
| 020 | 00001001001000001001010010 | 084 | 00001001000001000000010000 |
| 021 | 00001001001001001000000010010 | 085 | 00001001000001000001010010 |
| 022 | 00001001001001001001010010000 | 086 | 00001001000001001001000010 |
| 023 | 01000000000010000000000010 | 087 | 00001001001010000000000010000 |
| 024 | 01000000000010000000001010000 | 088 | 00001001001000000001010010 |
| 025 | 01000000001000000010010010 | 089 | 00001001001000001000010010 |
| 026 | 01000000001000001001000010 | 090 | 00001001001000001010000010 |
| 027 | 01000000010000001000001010010 | 091 | 00001001001000010010010000 |
| 028 | 01000001000000100100010000 | 092 | 00001001001001000000010 |
| 029 | 01000001000001000000001010 | 093 | 00001001001001001010000010 |
| 030 | 01000001000001001000010000 | 094 | 00001001001001010010000 |
| 031 | 01000001000001001000010010 | 095 | 00001001001001001001010010 |
| 032 | 01000001001001001000001010 | 096 | 01000000000001000000010010 |
| 033 | 01000001001001000000010000 | 097 | 01000000000001000010010000 |
| 034 | 01000001001001000010010010 | 098 | 01000000001000000010010 |
| 035 | 01000001001001001010010010 | 099 | 01000000001000000000010010 |
| 036 | 01001000000001000000000010010 | 100 | 01000000001000000010010000 |
| 037 | 01001000000001000000010010 | 101 | 01000000001000010000010000 |
| 038 | 01001000001000000010000010 | 102 | 01000000001000010010010010 |
| 039 | 01001000001000010000010000 | 103 | 01000000001001000000000010 |
| 040 | 01001000001000100010010010 | 104 | 01000000100100100010000 |
| 041 | 01001000001001000010010010 | 105 | 01000001000000000010000010 |
| 042 | 01001000001001001000010010 | 106 | 01000001000000010000000010 |
| 043 | 01001000001001001000100001000 | 107 | 01000001000000010000010000 |
| 044 | 01001001000001000000000010 | 108 | 01000001000000010010010 |
| 045 | 01001001000001000000010000 | 109 | 01000001000000100000000010 |
| 046 | 01001001000001000001010010 | 110 | 01000001000001000010010 |
| 047 | 01001001000001001000010 | 111 | 01000001000010010000010 |
| 048 | 01001001001000010000010010 | 112 | 01000001000010010010000010 |
| 049 | 01001001001000010010010000 | 113 | 01000001000010010010010000 |
| 050 | 01001001001001000000010 | 114 | 01000001010000010000010 |
| 051 | 01001001001001001010000010 | 115 | 01000001010000010010010000 |
| 052 | 01001001001001001010010010 | 116 | 01000001010010010000010 |
| 053 | 00000001000000010010010 | 117 | 01000001000100100010000010 |
| 054 | 00000001000000001000010010 | 118 | 01000001001001000010010 |
| 055 | 00000001000000001010000010 | 119 | 01000001010010010010010 |
| 056 | 00000001000000001010010000 | 120 | 01000001010010010010010010 |
| 057 | 00000001000001000010000010 | 121 | 01001000000000001000000010 |
| 058 | 00000001000001001000000010 | 122 | 01001000000001000000000010 |
| 059 | 00000001000001001000010000 | 123 | 01001000000000100000010000 |
| 060 | 00000001000001001001010010 | 124 | 01001000000000100000010010 |
| 061 | 00000001001000000100000010 | 125 | 01001000000000100100010000010 |
| 062 | 00000001001001000010010000010 | 126 | 01001000001000000000010000 |
| 063 | 00000001001001000000010000 | 127 | 01001000001000000100100010 |

FIG. 6B

| DATA | CODEWORD | DATA | CODEWORD |
|---|---|---|---|
| 128 | 0100100000100000100000010010 | 192 | 0000000100000000000010010000 |
| 129 | 0100100000100000100100000010 | 193 | 0000100000000000010000010000 |
| 130 | 0100100000100000100100010000 | 194 | 0000100000000000100100010010 |
| 131 | 0100100000100100000100000010 | 195 | 0000100000000100100000010010 |
| 132 | 0100100000100100100000000010 | 196 | 0000100000000100100100010000 |
| 133 | 0100100000100100100000010000 | 197 | 0000100000100100000000010010 |
| 134 | 0100100000100100100010010010 | 198 | 0000100000100100000010010000 |
| 135 | 0100100100000000100000010010 | 199 | 0000100100100000000000010010 |
| 136 | 0100100100000000100100010000 | 200 | 0000100100100000000010010000 |
| 137 | 0100100100000100000000010010 | 201 | 0100000000000100000000010000 |
| 138 | 0100100100000100000010000010 | 202 | 0100000000000100000010010010 |
| 139 | 0100100100000100000100010000 | 203 | 0100000000000100010010000010 |
| 140 | 0100100100000100100000010000 | 204 | 0100000000100000100000010010 |
| 141 | 0100100100000100100010010010 | 205 | 0100000000100000100100010000 |
| 142 | 0100100100100000000010000010 | 206 | 0100000000100000010000000010 |
| 143 | 0100100100100000100000000010 | 207 | 0100000000100100100000010000 |
| 144 | 0100100100100000100000010000 | 208 | 0100000000100100100100010010 |
| 145 | 0100100100100000100010010010 | 209 | 0100000100000100000000010010 |
| 146 | 0100100100100100000000010000 | 210 | 0100000100000100000010010000 |
| 147 | 0100100100100100000010010010 | 211 | 0100000100100000000010000010 |
| 148 | 0100100100100100100000010010 | 212 | 0100000100100000100000010000 |
| 149 | 0100100100100100100010000010 | 213 | 0100000100100000100100010010 |
| 150 | 0100100100100100100100010000 | 214 | 0100000100100100100000010010 |
| 151 | 0000000100000000100000000010 | 215 | 0100000100100100100100010000 |
| 152 | 0000000100000100000000010000 | 216 | 0100100000010000000000010010 |
| 153 | 0000000100000100000100100100 | 217 | 0100100000100000000010010000 |
| 154 | 0000000100000100100100000010 | 218 | 0100100100000000000010000010 |
| 155 | 0000000100100000100000010010 | 219 | 0100100100000000100000010000 |
| 156 | 0000000100100000100010010000 | 220 | 0100100100000000100100010010 |
| 157 | 0000000100100100000010000010 | 221 | 0100100100000100000000010000 |
| 158 | 0000000100100100100000010000 | 222 | 0100100100000100100100010000 |
| 159 | 0000000100100100100010010010 | 223 | 0100100100100100000000010010 |
| 160 | 0000100000000100000000010010 | 224 | 0100100100100100000010010000 |
| 161 | 0000100000100000000000010000 | 225 | 0000000100000100000000010010 |
| 162 | 0000100000100000000100010010 | 226 | 0000000100000100000010010000 |
| 163 | 0000100000100000010010000010 | 227 | 0000000100100000000010000010 |
| 164 | 0000100100000000100000010010 | 228 | 0000000100100000100000010000 |
| 165 | 0000100100000000100100010000 | 229 | 0000000100100000100100010010 |
| 166 | 0000100100000100000010000010 | 230 | 0000000100100100100000010010 |
| 167 | 0000100100000100100000010000 | 231 | 0000000100100100100010010010 |
| 168 | 0000100100000100100000010000 | 232 | 0000100000000000100100000010 |
| 169 | 0000100100000100100100010010 | 233 | 0000100000000100100000000010 |
| 170 | 0000100100100000100000000010 | 234 | 0000100000100000000000010010 |
| 171 | 0000100100100100000100000010 | 235 | 0000100000100000000100010000 |
| 172 | 0000100100100100000100010010 | 236 | 0000100000100100000000000010 |
| 173 | 0000100100100100100010000010 | 237 | 0000100100000000000100000000 |
| 174 | 0100000100000000000100010010 | 238 | 0000100100000000010000010000 |
| 175 | 0100000100000000100100000010 | 239 | 0000100100000000100100100010 |
| 176 | 0100000100000100100000000010 | 240 | 0000100100000100100000010010 |
| 177 | 0100000100100100000000000010 | 241 | 0000100100000100100100010000 |
| 178 | 0100100000000000010000010010 | 242 | 0000100100100100000000010010 |
| 179 | 0100100000000000100100010000 | 243 | 0000100100100100000010010000 |
| 180 | 0100100000000100000010000010 | 244 | 0100000000000100000010000010 |
| 181 | 0100100000000100100000010000 | 245 | 0100000000000100100000010010 |
| 182 | 0100100000000100100010010010 | 246 | 0100000000000100100100010010 |
| 183 | 0100100000100000100000000010 | 247 | 0100000000100000100000000010 |
| 184 | 0100100000100000000000010000 | 248 | 0100000000100000100000010000 |
| 185 | 0100100000100000100100010010 | 249 | 0100000000100100000010010010 |
| 186 | 0100100000100100010010000010 | 250 | 0100000000100100100000000010 |
| 187 | 0100100100000000000010000010 | 251 | 0100000100000000000100010000 |
| 188 | 0100100100100000000010000000 | 252 | 0100000100001000000000000010 |
| 189 | 0100100100100000000010010010 | 253 | 0100000100100000000000010000 |
| 190 | 0100100100100000100010000010 | 254 | 0100000100100000000100010010 |
| 191 | 0100100100100100100000000010 | 255 | 0100000100100000100010000010 |

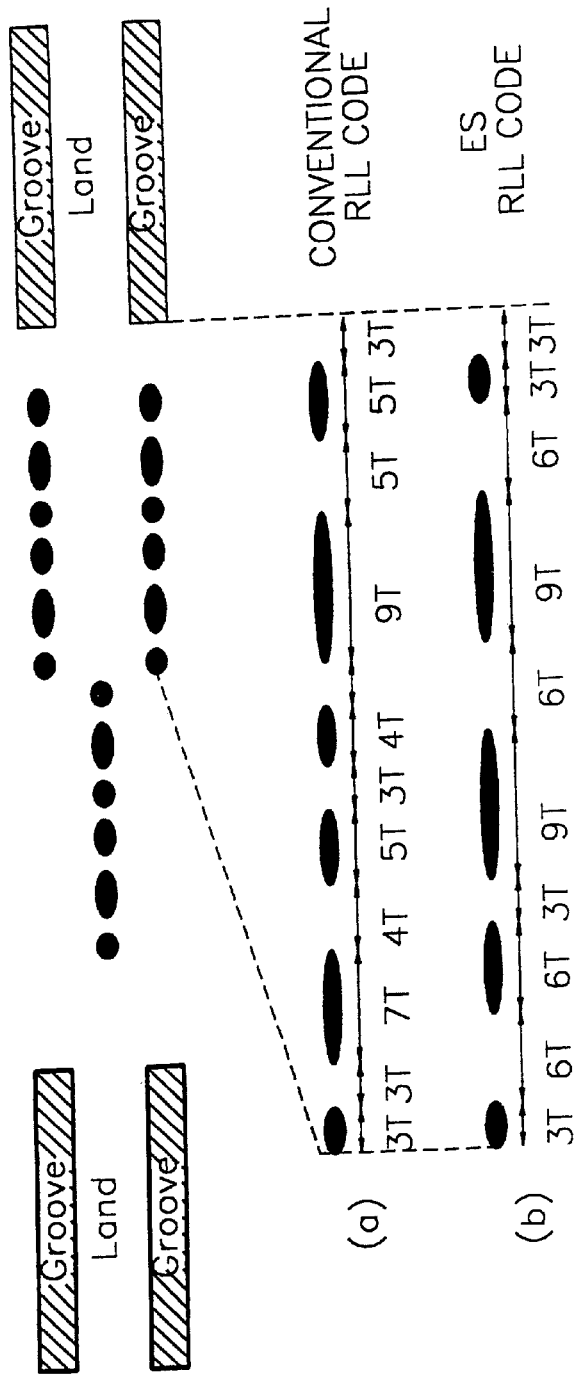

DATA MODULATION AND CORRECTION METHODS FOR USE WITH DATA WRITTEN TO AND READ FROM RECORDING MEDIA

CROSS-REFERENCE TO RELATED APPLICATIONS

This application claims the benefit of Korean Application No. 2000-59840, filed Oct. 11, 2000, in the Korean Industrial Property Office, the disclosure of which is incorporated herein by reference.

BACKGROUND OF THE INVENTION

1. Field of the Invention

The present invention relates to data modulation and correction methods, and more particularly, to a code modulation method for modulating data to be resistant to channel distortion and a method of correcting errors in detecting the data modulated by the modulation method.

2. Description of the Related Art

With the increased recording density of optical storage media, track pitches of digital versatile disc random access memories (DVD-RAMs), recordable DVD (DVD-R), or DVD rewritable (DVD-RW) become narrow. Accordingly, introduction of crosstalk or noise from neighbor tracks and the amount of inter-symbol interference (ISI) from neighbor pits are increasing. This disturbance increases jitter of a radio frequency (RF) signal, particularly when an optical storage medium whose physical address is recorded as pits are accessed.

Run length limited (RLL) codes having limited maximum and minimum constraints are common data modulation codes for optical storage media. A minimum run length, which is denoted by parameter "d," greatly affects accuracy in detecting pits (or lands) in an optical disc and a recording density of an RLL code. The maximum run length, which is denoted by parameter "k," is associated with code efficiency and code strategy. Common RLL codes also include consecutive run lengths between the minimum and maximum run lengths. For example, for eight-to-fourteen modulation plus (EFM+) codes compatible with the DVD family recording media, with d=2 and k=10, 1T (where T is a reproduction clock) spaced codes, excluding a sync code, exist at pit lengths 4T, 5T, . . . , and 10T between a minimum pit length of 3T and a maximum pit length of 11T. FIG. 1 is a histogram of the run length distribution of the EFM+codes. However, when jitter occurs in an RF signal being reproduced, due to any distortion in a channel, with the 1T spaced pits as shown in FIG. 1, a deviation of ±0.5T can increase the likelihood of data read error.

FIG. 2 is a table of a physical address format in a header field of a general DVD-RAM. For the general DVD-RAM, the same address data are written twice to the header field for high detection performance. The header field includes variable frequency oscillator (VFO1) data for a phase locked loop (PLL), address mark (AM) data, physical identification data (PID1), ID error detection data (IED1), and postamble data (PA1) for IED1 demodulation. To increase address detection, VFO2, AM, PID2, IED2, and PA2, which have the same functions as those above, are also written to the header field. However, even though address detection performance is improved, writing the physical address data based upon this RLL modulation code causes a redundancy problem.

SUMMARY OF THE INVENTION

To solve the above-described problems, it is an object of the present invention to provide a data modulation method modulating data to be resistant to channel disturbance/distortion, to provide a data modulation method increasing data detection performance, to provide a data modulation method reducing redundancies in the physical address sector (field) while maintaining improved address detection, and to provide a method of correcting errors occurring in reading the data written by a modulation method.

Additional objects and advantages of the invention will be set forth in part in the description which follows and, in part, will be obvious from the description, or may be learned by practice of the invention.

To achieve the above objects and other objects of the present invention, there is provided a data modulation method to write data to an optical storage medium using an extended space run length limited (ES RLL) modulation code, the ES RLL modulation code being expressed as RLL (d, k, m, n, s) with s=2 or greater, where d is minimum run length, k is maximum run length, m is the data bit length before modulation, n is the codeword bit length after modulation, s is the space length between codewords, and using prescribed coding/modulation rules specifying run lengths as $i_{n+1}=i_n+s$ (n=1, 2, . . . ).

It is preferable that, in the ES RLL modulation code, the run length is one of 2, 5, 8, and 11, the number of lead zeros of a codeword is one of 1, 4, and 7, and the number of end zeros of a codeword is one of 1 and 4.

It is preferable that the ES RLL modulation code is applied to write address data to a physical sector of the optical storage medium, the address data being required for data access.

It is preferable that the ES RLL modulation code is pre-formed as pits in the optical storage medium to write and store management information, for example, copyright information.

It is preferable that the data modulation method comprises discarding codewords modulated with the ES RLL modulation code that have a maximum run length to generate a read clock signal and a synchronization clock signal.

It is preferable that the data modulation method comprises discarding codewords modulated with the ES RLL modulation code that have a codeword digital sum (CDS) whose absolute value is relatively great, with preference of deleting the codewords having greatest CDS absolute value.

To achieve the above objects and other objects of the present invention, there is provided a data modulation method to write data to an optical storage medium using an extended space run length limited (ES RLL) modulation code, the ES RLL modulation code being expressed as ES RLL (d, k, m, n, s), where d is minimum run length, k is maximum run length, m is the data bit length before modulation, n is the codeword bit length after modulation, s is the space length between codewords, the data modulation method comprising, generating codewords satisfying an RLL (d, k, m, n, s≧2) code, using coding rules specifying run lengths as $i_{n+1}=i_n+s$ (n=1, 2, . . . ) and removing codewords having a maximum pit length from the generated codewords, and creating a codeword table of the remaining codewords, where T is a reproduction clock signal. In an embodiment, for example, the ES RLL code can be expressed as (2, 11, 8, 27, 3) and codewords having a maximum pit length of 12T be removed from the generated codewords.

The data modulation method further comprises, discarding from the codeword table codewords having a codeword digital sum (CDS) value whose absolute value is relatively great, and arranging the remaining codewords in ascending order of the absolute value of the CDS to reduce a direct current (DC) component of the codewords.

To achieve the above objects and other objects of the present invention, there is provided a data correction method to correct data read from an optical storage medium after the data has been written to the optical storage medium according to a run length limited (RLL) modulation code expressed as RLL (d, k, m, n, s), where d is minimum run length, k is maximum run length, m is the data bit length before modulation, n is the codeword bit length after modulation, and s is the space length between codewords, the correction method comprising, counting the run lengths of code sequences read from the optical storage medium by detecting bit transitions in the code sequences, and if an N-th pit that does not comply with prescribed RLL coding rules is detected, checking the run lengths of following M pits, and if the run length of any of the following M pits does not comply with the prescribed RLL coding rules, correcting the run length of the N-th pit according to the prescribed RLL coding rules.

The correction method further comprises, that if the run length of the N-th pit is s/2 less than a run length of the prescribed RLL code, correcting the N-th pit by adding s/2 to the run length of the N-th pit; and correcting the (N+1)th pit by subtracting s/2 from the run length of the (N+1)th pit.

The correction method further comprises, that if the run length of the N-th pit is s/2 greater than a run length of the prescribed RLL code, correcting the N-th pit by subtracting s/2 from the run length of the N-th pit; and correcting the (N+1)th pit by adding s/2 to the run length of the (N+1)th pit.

The data correction method above further comprises that, when using an ES RLL and s=3, if the run length of the N-th pit is 1 less than a run length of the ES RLL code, correcting the N-th pit by adding 1 to the run length of the N-th pit; and correcting the (N+1)th pit by subtracting 1 from the run length of the (N+1)th pit.

The data correction method above further comprises that when using an ES RLL and s=3, if the run length of the N-th pit is 1 greater than a run length of the ES RLL code, correcting the N-th pit by subtracting 1 from the run length of the N-th pit; and correcting the (N+1)th pit by adding 1 to the run length of the (N+1)th pit.

To achieve the above objects and other objects of the present invention, there is provided a data correction method to correct data read from an optical storage medium after the data has been written to the optical storage medium with an extended space run length limited (ES RLL) modulation code expressed as ES RLL (d, k, m, n, s) with s≧2, where d is minimum run length, k is maximum run length, m is the data bit length before modulation, n is the codeword bit length after modulation, and s is the space length between codewords, the method comprising, counting the run lengths of code sequences read from the optical storage medium by detecting bit transitions, determining whether the counted run lengths comply with prescribed ES RLL modulation rules, where run lengths are expressed as $i_{n+1}=i_n+s$ (n=1, 2, . . . ) with an initial run length of $i_1$=d, and if an N-th pit which is not equal any of the run lengths $i_n$ is detected, checking the run lengths of the following M pits; and (b) if the run length of at least one of the M pits is not equal to the run lengths $i_n$, correcting the run length of the N-th pit according to the prescribed ES RLL modulation rules. In an embodiment, the initial run length can, for example, be set to $i_1$=1 or $i_1$=2 if d=1 and d=2, respectively.

The correction method further comprises, correcting the run length of the N-th pit by adding a value to or subtracting a value from the run length of the N-th pit such that the run length of the N-th pit is equal to a run length $i_n$ of the ES RLL that has an absolute value closest to the run length of the N-th pit, and correcting the run length of the (N+1)th pit by subtracting from or adding to the run length of the (N+1)th pit the value which is added or subtracted to the Nth pit. The value added or subtracted from the run length of the N-th pit can be based on whether a codeword after correcting the run length of the N-th pit would have a CDS having an absolute value closest to a CDS of a codeword before correcting the run length of the N-th pit, thereby maintaining absolute values of the CDS of codewords to be small.

BRIEF DESCRIPTION OF THE DRAWINGS

The above objects and advantages of the present invention will become more apparent by describing in detail preferred embodiments thereof with reference to the attached drawings in which:

FIG. 1 is a histogram of the run length distribution of EFM+codes;

FIG. 2 is a table of the physical address format in the header field of a general digital versatile disc random access memory (DVD-RAM);

FIG. 3 is a histogram of the distribution of a codestream modulated by a data modulation method according to the present invention;

FIG. 4 is a table of the codewords generated according to prescribed rules and classified by a codeword digital sum (CDS);

FIGS. 5A and 5B are tables of extended space run length limited (ES RLL) (2, 11, 8, 27, 3) modulation codewords from which codewords having a maximum pit length of 12T are discarded;

FIGS. 6A and 6B are tables of ES RLL (2, 11, 8, 27, 3) modulation codewords which have CDS whose absolute value are smaller;

FIG. 9 shows the structure of the physical address data written to an optical storage medium for a conventional RLL code (a) and the ES RLL code according to the present invention (b);

FIG. 10 is a table showing the data format of the physical address sector of an optical storage medium to which the ES RLL code according to the present invention is applied;

DETAILED DESCRIPTION OF THE PREFERRED EMBODIMENTS

Figure 7:
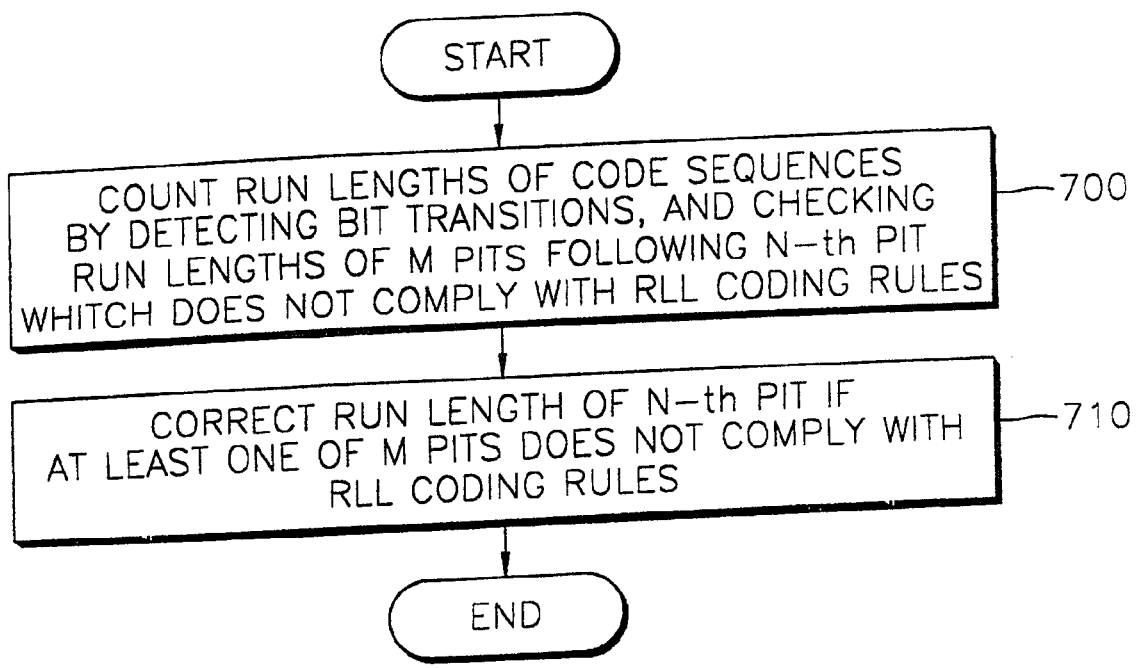
FIG. 7 is a flowchart illustrating a method of correcting errors caused by jitter when data written to an optical storage medium with the ES RLL modulation code according to the present invention are read.

A data modulation method according to the present invention writes data to an optical storage medium using a modulation code with pits spaced 2T or greater, thereby reducing detection errors. FIG. 3 is an exemplary histogram of the distribution of the codestream generated by a data modulation method according to the present invention. Use of codes with 2T or 3T spaced pits further improve data detection performance, compared to 1T spaced pits, for the same amount of jitter. Although the 2T or 3T spaced pits are disadvantageous in terms of recording density due to the increased pit space lengths, codes written with 2T or greater space between pits are effective for management information, such as physical address data or copyright information, written to a disc, in terms of improved detection performance with reduced errors in the presence of jitter.

The modulation method according to the present invention relates to generation of RLL(d, k, m, n, s) modulation codes with s=2 or greater for improved detection performance, where d is minimum run length, k is maximum run length, m is the data bit length before modulation, n is the codeword bit length after modulation, s is the space length between codewords, and using prescribed coding/modulation rules expressing run lengths as $i_{n+1}=i_n+s$ (n=1, 2, ...). According to this modulation, space between pits is extended to be 2T or greater, so the modulation code of the present invention is called "extended space modulation (ES RLL) code." Here, the run length means the number of consecutive "0"s between neighboring logical "1"s in binary code sequences.

For example, ESS RLL (2, 11, 8, 27, 3) codewords as shown in the histogram of FIG. 3, which are generated with s=3, can be obtained according to the following modulation rules:

(1) Run length $\in$ {2, 5, 8, 11}
(2) Lead zero of a codeword $\square$ {1, 4, 7}, and
(3) End zero of a codeword $\in$ {1, 4}.

According to Rule (1), the length of pits is one of 3T, 6T, 9T, or 12T. Rules (2) and (3) are established such that Rule (1) is satisfied when codewords are connected. For example, if the trailing end of a codeword has one zero, and the following codeword has one zero at its leading end, the run length between the two codewords becomes 2, satisfying the minimum run length defined by Rule (1). If the trailing end of a codeword has 4 zeros, and the following codeword has four zeros at its leading end, the run length between the two codewords becomes 8, which is less than the maximum run length of Rule (1). According to this modulation, space between pits is extended by 3T. The number of codewords satisfying Rules (1) through (3) is 293 in total, and the number of codewords having at least one maximum pit length of 12T is 63.

FIG. 4 is a table of the codewords generated to comply with Rules (1) through (3), which are classified by a codeword digital sum (CDS). CDS refers to the result of summation of binary bits "1" and "0" in each codeword, wherein bits "0" are replaced by "−1" for the summation.

FIGS. 5A and 5B are tables of the ES RLL (2, 11, 8, 27, 3) modulation codewords discarded to avoid a problem in the reproduction of a clock signal or of sync mismatching. Therefore, the discarded 63 codewords may include one or more pits having the maximum length of 12T.

FIGS. 6A and 6B are tables of ES RLL (2, 11, 8, 27, 3) modulation codewords which have a CDS whose absolute value is smaller. In other words, codewords having a CDS whose absolute value is relatively great, for example, codewords having greatest CDS absolute value or giving preference to codewords having the greatest CDS absolute value, are removed from the modulation codewords in FIGS. 6A and 6B so as to reduce the running digital sum (RDS) for direct current (DC) suppression control of the codewords. A range of absolute values considered to be relatively great can be determined at a user's (code maker's) discretion.

The ES RLL modulation codes can be pre-formed as pits in the physical address sector (header field) of an optical storage medium, to write physical address data for indicating data locations or other management information, for example, copyright information.

An error correction method applied in detecting codewords modulated by the RLL modulation method and by the ES RLL modulation method described above, will now be described.

FIG. 7 is a flowchart illustrating a method of correcting errors caused by jitter when reading data written to an optical storage medium with the RLL modulation code. In correcting errors in the data written with an RLL (d, k, m, n, s) code and read from an optical storage medium, first the run lengths of code sequences read from the optical storage medium are counted by detecting bit transitions therein. If an Nth-pit (or mark) which does not comply with the RLL coding rules is detected, the run lengths of the following M pits are checked (operation 700). If the run length of any of the following M pits does not comply with the RLL coding rules, the run length of the N-th pit is corrected according to the RLL coding rules (operation 710).

In operation 710 of FIG. 7, if the run length of the N-th pit is s/2 less than the run length of the RLL code, the N-th pit is corrected by adding s/2 to the run length of the N-th pit, and the (N+1)th pit is corrected by subtracting s/2 from the run length of the (N+1)th pit. If the run length of the N-th pit is s/2 greater than the run length of the RLL code, the N-th pit is corrected by subtracting s/2 from the run length of the N-th pit, and the (N+1)th pit is corrected by adding s/2 to the run length of the (N+1)th pit. Therefore, s/2 is used to determine whether a codeword's run length is greater than or less than one of the desirable run lengths of RLL or ES RLL coding rules and to correct the codeword's run length to the one desirable run length. For example, if according to the present invention codewords have "desirable" run lengths of 3T, 5T, 7T, 9T and 11T, which have 2T (s=2) between the codewords, a codeword having a run length of 4T is corrected to have one of the desirable run lengths. The 4T run length exceeds 3T by 1T (that is s/2, 1), such that the codeword with the 4T run length should be corrected by subtracting 1T from its run length.

For example, for an ES RLL (d, k, s) code with s=3 and the run lengths expressed as $i_{n+1}=i_n+3$ (n=1, 2, ...), in operation 710 of FIG. 7, if the run length of the N-th pit is 1 less than the run length of the ES RLL code, the N-th pit is corrected by adding 1 to the run length of the N-th pit, and the (N+1)th pit is corrected by subtracting 1 from the run length of the (N+1)th pit. If the run length of the N-th pit is 1 greater than the run length of the ES RLL code, the N-th pit is corrected by subtracting 1 from the run length of the N-th pit, and the (N+1)th pit is corrected by adding 1 to the run length of the (N+1)th pit.

In correcting data read from an optical storage medium after having been written in an ES RLL (d, k, m, n, s) code with s≧2, where d is minimum run length, k is maximum run length, m is the data bit length before modulation, n is the codeword bit length after modulation, and s is the space length between codewords, the run lengths of code sequences read from the optical storage medium are counted by detecting bit transitions therein. Next, it is determined whether the counted run lengths comply with the ES RLL modulation rules, where the run lengths are expressed as $i_{n+1}=i_n+s$ (n=1, 2, . . . ) with an initial run length of $i_1=d$. Therefore, if d=1, then $i_1=1$ and if d=2, then $i_1=2$. If an N-th pit which does not equal any of the run lengths in is detected, the run lengths of the following M pits are checked. If the run length of at least one of the M pits is not equal to the run lengths in the run length of the N-th pit is corrected to comply with the ES RLL modulation rules.

In particular, the run length of the N-th pit is corrected by adding a value to or subtracting a value from the run length of the N-th pit such that the run length of the N-th pit is equal to a run length in of the ES RLL that has an absolute value closest to the run length of the N-th pit, and is followed by correction in the run length of the (N+1)th pit. If a value is added to or subtracted from the run length of the N-th pit, the run length of the (N+1)th pit is corrected by subtracting the added value from or adding the subtracted value to the same. For example, if the N-th pit is 4T and desirable run lengths in are 3T, 6T, 9T, etc., 3T is the absolute value closest to 4T. Therefore, the N-th pit's 4T run length is corrected by subtracting 1T from its run length to provide a 3T run length, which is one of the desirable run lengths in. The value added or subtracted from the run length of the N-th pit can be based on whether a codeword after correcting the run length of the N-th pit has a CDS having an absolute value closest to a CDS of a codeword before correcting the run length of the N-th pit, thereby maintaining absolute values of the CDS of codewords to be small.

As an example embodiment, in correcting data read from an optical storage medium which was written in an RLL (d, k, m, n, s) code with d=1 and s=3, where d is minimum run length, k is maximum run length, m is the data bit length before modulation, n is the codeword bit length after modulation, and s is the space length between codewords, the run lengths of code sequences read from the optical storage medium are counted by detecting bit transitions therein. Next, it is determined whether the counted run lengths comply with the RLL modulation rules, where the run lengths are expressed as $i_{n+1}=i_n+3$ (n=1, 2, . . . ) with an initial run length of $i_1=1$. If an N-th pit which does not equal to the run lengths in is detected, the run lengths of the following M pits are checked. If the run length of at least one of the M pits is not equal to the run lengths in the run length of the N-th pit is corrected to comply with the RLL modulation rules.

In the data correction methods described above, if the run lengths of the M pits comply with the RLL and ES RLL coding rules, even if an error is detected in the N-th pit, the run length of the N-th pit is not corrected to prevent error propagation.

Figure 8:
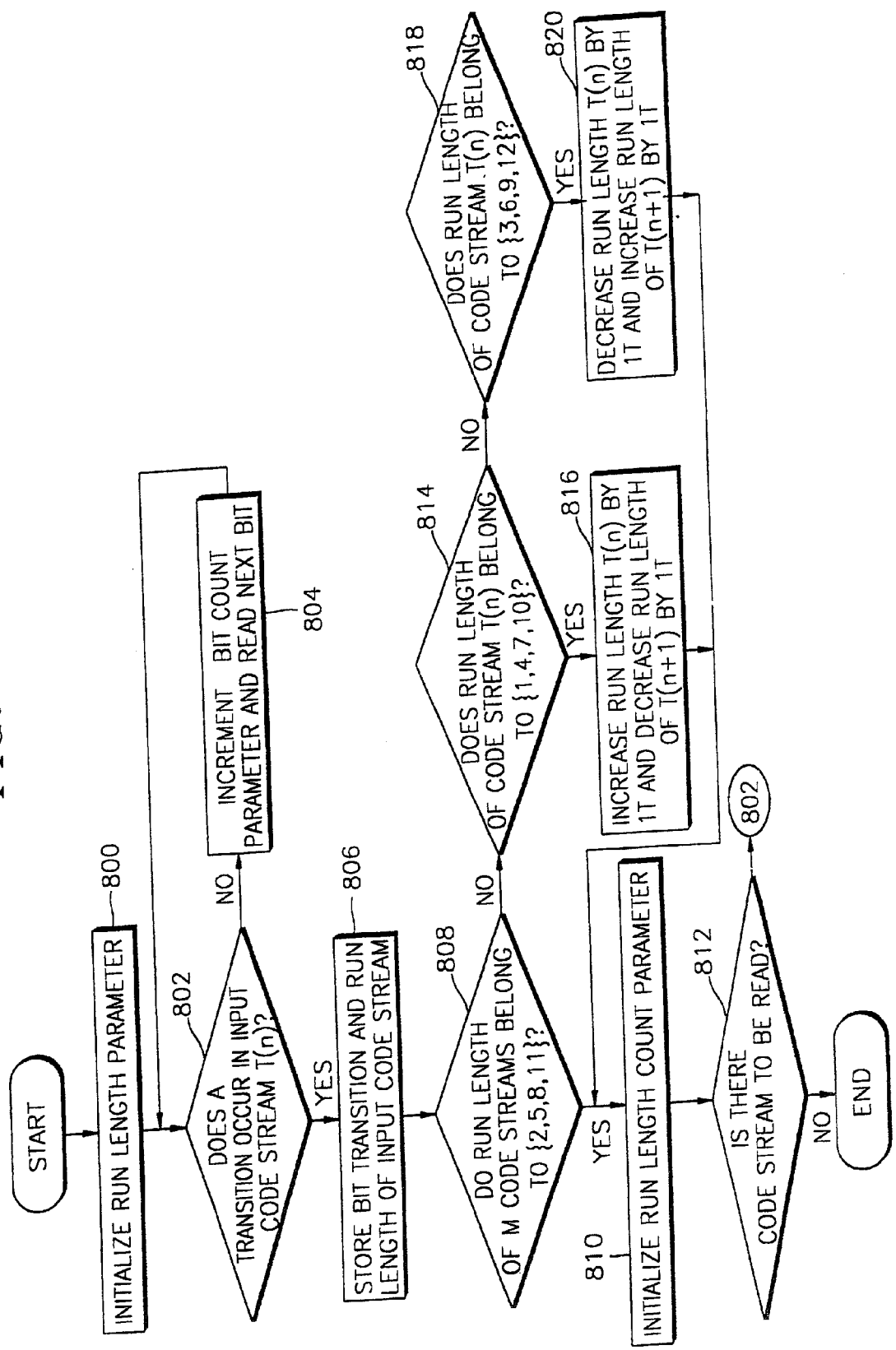
FIG. 8 is a flowchart illustrating an error correction method in detecting codewords modulated by an ES RLL (2, 11, 8, 27, 3) code.

FIG. 8 is a flowchart illustrating the error correction method according to the present invention for detecting data written to an optical disc using the ES RLL (2, 11, 8, 27, 3) modulated code and the corresponding modulation rules (1)–(3) described above. When a code stream T(n) is input, a run length count parameter is initialized (operation 800). Next, it is determined whether a transition occurs in a current bit of the input code stream (operation 802). If no transition occurs in the current bit, a bit count parameter is incremented to read a next bit (operation 804), and operation 802 is performed again. If a transition is detected in operation 802, the bit transition position and the run length of the input code stream T(n) are stored (operation 806). The above operations are repeated for M code streams T(n+1), T(n+2), T(n+3), and T(n+4), following the code stream T(n), where M=4 in this exemplary embodiment. Next, it is checked whether the run length of each of the M code streams belong to {2, 5, 8, 11} run lengths (operation 808). The run lengths are expressed as $i_{n+1}=i_n+3$ (n=1, 2, . . . ) with the initial run length $i_1=2$. In other words, it is determined whether the M code streams have 3T, 6T, 9T, or 12T pit lengths. If all the run lengths of the code streams T(n+1), T(n+2), T(n+3), and T(n+4) belong to {2, 5, 8, 11}, the run length count parameter is initialized (operation 810). Next, it is determined whether there is a code stream to be read (operation 812). If there is no code stream to be read, the process stops. If there is a code stream to be read, the process goes to operation 802. If it is determined in operation 808 that the run length of at least one of the M code streams T(n+1), T(n+2), T(n+3), and T(n+4) does not belong to {2, 5, 8, 11}, it is determined whether the run length of the code stream T(n) stored in step 806 belongs to {1, 4, 7, 10} run lengths (operation 814). If the run length of the code stream T(n) stored in operation 806 belongs to {1, 4, 7, 10} run lengths, it means that the code stream T(n) has a run length 1T shorter than the desired run length and a pit length of 2T, 5T, 8T, or 11T, which is 1 T shorter than the desired pit length. The pit length 2T, 5T, 8T, or 11T is corrected into 3T, 6T, 9T, or 12T, respectively, by increasing the run length of the code stream T(n) by 1T. Subsequently, the code stream T(n+1) following the code stream T(n) is corrected by subtracting 1T from the run length of the code stream T(n+1) (operation 816). If it is determined in operation 814 that the run length of the code stream T(n) does not belong to {1, 4, 7, 10}, it is determined whether the run length of the code stream T(n) belongs to {3, 6, 9, 12} run lengths (operation 818). If the run length of the code stream T(n) belongs to {3, 6, 9, 12} run lengths, it means that the code stream T(n) has a run length 1T longer than the desired run length and a pit length of 4T, 7T, 10T, or 13T, which is 1T shorter than the desired pit length. The pit signal 4T, 7T, 10T, or 13T is corrected into 3T, 6T, 9T, or 12T, respectively, by reducing the run length of the code stream T(n) by 1T. Subsequently, the code stream T(n+1) following the code stream T(n) is corrected by adding 1T to the run length of the code stream T(n+1) (operation 820).

The data correction according to the present invention is referred to as "SRC detection (Slide Run length Compensation looking forward pits)" because the correction is performed by checking pit lengths for compliance with the applied coding rules.

FIG. 9 shows the format of the physical address data written to an optical storage medium for a conventional RLL code (a) and the ES RLL code according to the present invention (b). FIG. 10 is a table showing the data format of the physical sector of an optical storage medium to which the ES RLL code according to the present invention is applied. As shown in FIG. 10, the physical address data includes variable frequency oscillator (VFO) data for a phase locked loop (PLL), address mark (AM) data, physical identification data (PID), and ID error detection data (IED). Unlike the conventional physical address data format having 1004 bits in total (as shown in FIG. 2), the constituent data are written once with a reduced total bit number of 783. As a result, there is an effect of 22% redundancy reduction in the physical address sector.

Figure 11A:
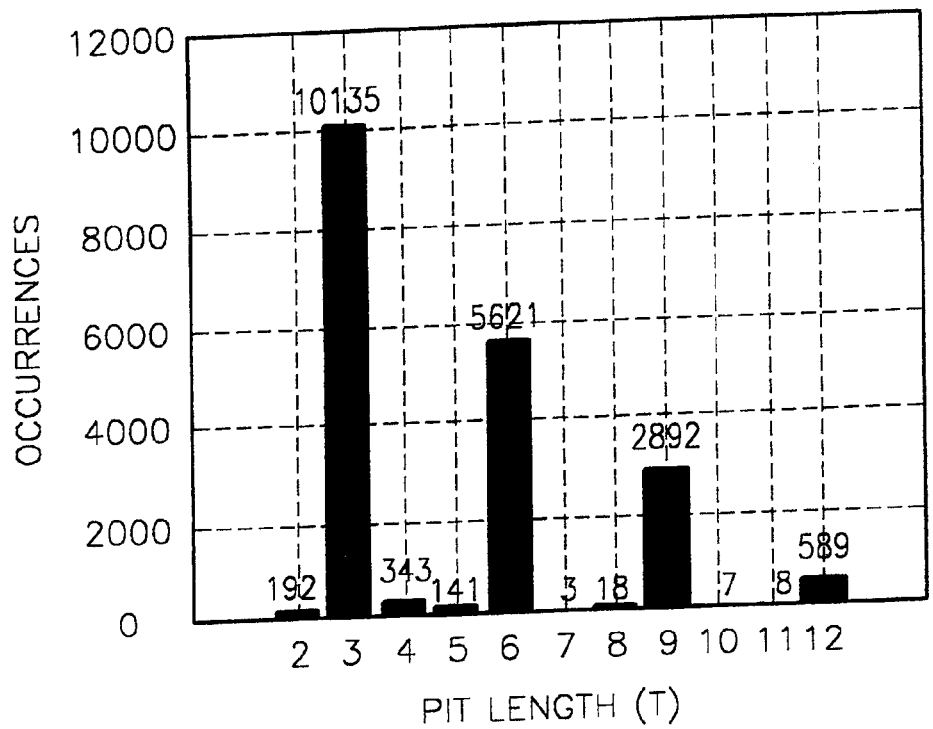
FIG. 11A is a histogram of the conventional RLL code stream digitized using a conventional level slicer.

FIG. 11A is a histogram of the RLL (d, k, s) code stream with d=2, k=11 and s=1, digitized using a conventional level slicer. As shown in FIG. 11A, pits of the code stream range from 2T to 12T in length with 1T space. 192 pits of 2T, 10135 pits of 3T, 343 pits of 3T, 141 pits of 5T, 5621 pits of 6T, 3 pits of 7T, 18 pits of 8T, 2892 pits of 9T, 7 pits of 10T, 8 pits of 11T, and 589 pits of 12T are detected. The pit lengths excluding 3T, 6T, 9T, and 12T pit lengths (i.e., pit lengths 2T, 4T, 5T, 7T, 8T, 10T and 11T can cause data read errors.

Figure 11B:
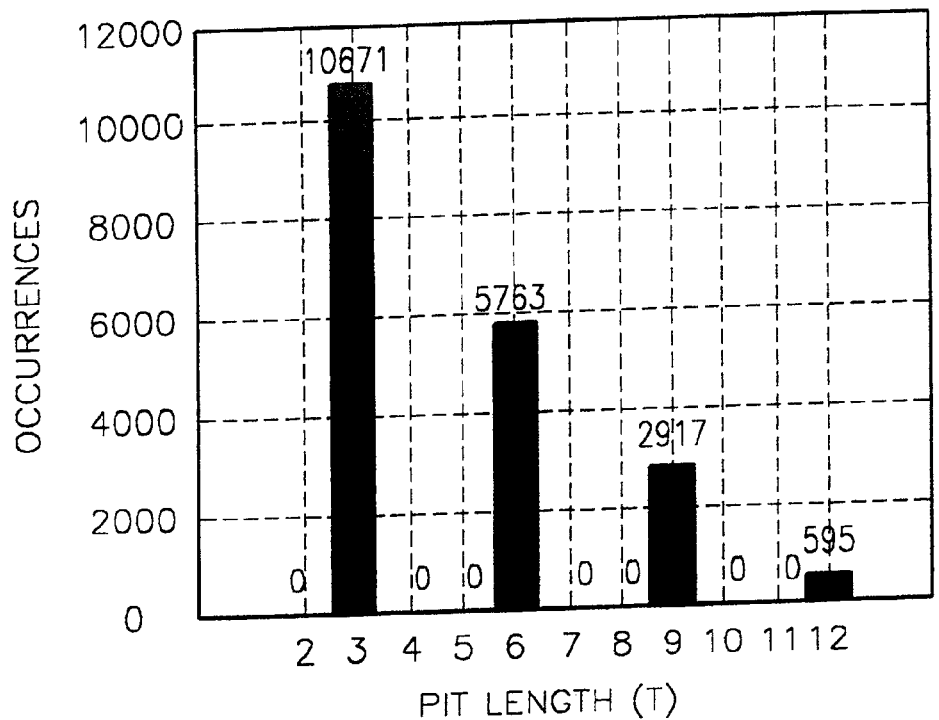
FIG. 11B is a histogram of the ES RLL code stream according to the present invention digitized using an SRC detector.

FIG. 11B is a histogram of the ES RLL (d, k, s) code stream with d=2, k=11 and s=2 according to the present invention digitized using an SRC detector according to the present invention. As shown in FIG. 11B, 10671 pits of 3T, 5763 pits of 6T, 1917 pits of 9T, and 595 pits of 12T are detected. The pit lengths that can cause data read errors, as shown in FIG. 11A, disappear.

Figure 12:
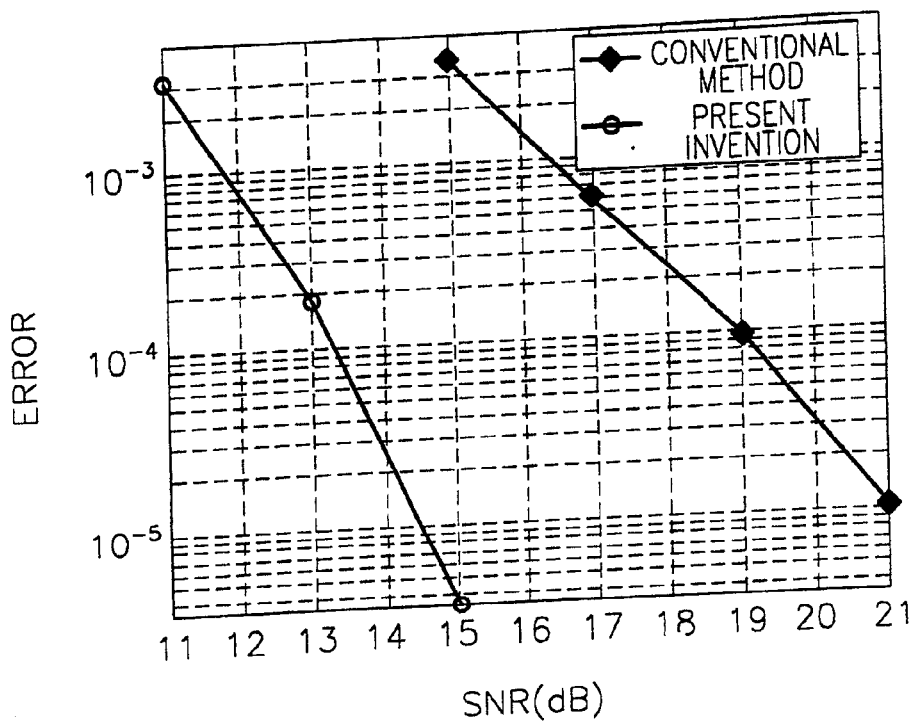
FIG. 12 is a graph showing code stream detection performance with respect to circuit noise for the conventional method and the present invention.
Figure 13:
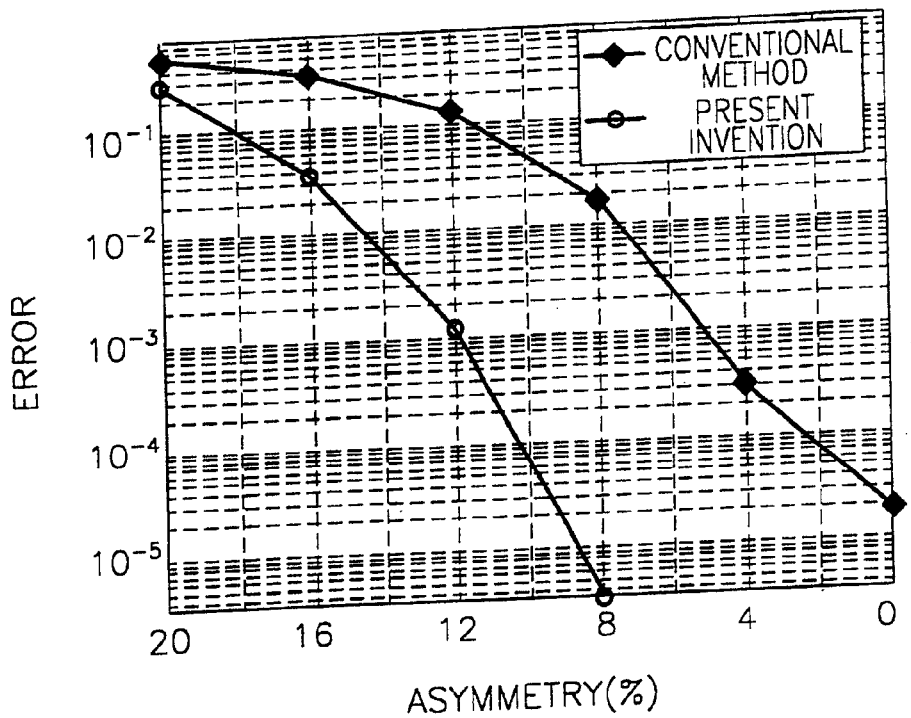
FIG. 13 is a graph showing code stream detection performance with respect to asymmetry for the conventional method and the present invention.
Figure 14:
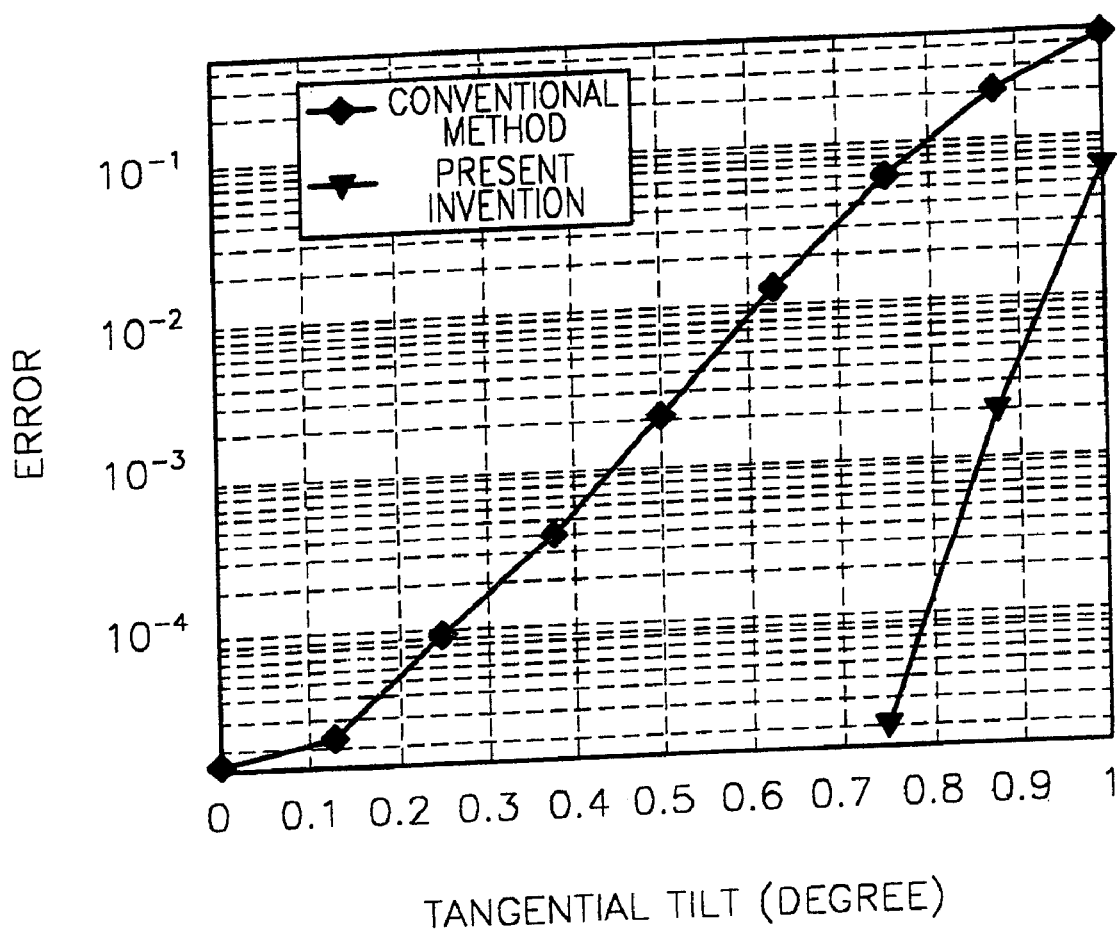
FIG. 14 is a graph showing code stream detection performance with respect to tangential skew of an optical storage medium for the conventional method and the present invention.

FIGS. 12 through 14 show the difference in detection efficiency between different coding methods. FIG. 12 is a graph showing code stream detection performance with respect to circuit noise for the conventional method and the present invention. As shown in FIG. 12, compared to the conventional method in which a level slicer is applied to the RLL code stream, when the SRC detection method of the present invention is applied to the ES RLL code stream according to the present invention, detection performance is improved such that the detection performance is at least 5 dB or greater than the conventional method.

FIG. 13 is a graph showing code stream detection performance with respect to asymmetry for the conventional method and the present invention. As shown in FIG. 13, when the ES RLL code stream according to the present invention is detected using the SRC detector according to the present invention, an asymmetry margin is about 5% greater than the conventional method.

FIG. 14 is a graph showing code stream detection performance with respect to the tangential skew of an optical storage medium for the conventional method and the present invention. As shown in FIG. 14, when the ES RLL code stream according to the present invention is detected using the SRC detector according to the present invention, a tilt margin at an error rate of $10^{-4}$ is about 0.5 degrees greater than the conventional method.

As described above, the data modulation and correction methods according to the present invention can reduce a redundancy in physical address data written to an optical storage medium and also improve detection performance tolerant to channel disturbance/distortion.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A data modulation method to write data to an optical storage medium, comprising:
generating codewords by encoding the data using a run length limited (RLL) modulation expressed as RLL (d, k, m, n, s), where d is minimum run length, k is maximum run length, m is a data bit length before modulation, n is a codeword bit length after modulation, and s is a space length between the codewords, s being equal to or greater than 2.

2. The data modulation method of claim 1, wherein, in the RLL modulation, a run length is one of 2, 5, 8, and 11, number of lead zeros of a codeword is one of 1, 4, and 7, and number of end zeros of a codeword is one of 1 and 4.

3. The data modulation method of claim 1, wherein the RLL modulation is applied to write address data of a physical sector of the optical storage medium, the write address data being required for accessing the data.

4. The data modulation method of claim 1, wherein the RLL modulation is pre-formed as pits in the optical storage medium to write and store data management information, comprising copyright information.

5. The data modulation method of claim 1, further comprising discarding the codewords having a maximum run length to generate a read clock signal and a synchronization clock signal.

6. The data modulation method of claim 1, further comprising discarding the codewords with a discarding preference given to the codewords having a codeword digital sum (CDS) whose absolute value is greatest.

7. A data modulation method to write data to an optical storage medium using a run length limited (RLL) modulation code, the RLL modulation code being expressed as RLL (d, k, m, n, s), where d is minimum run length, k is maximum run length, m is a data bit length before modulation, n is a codeword bit length after modulation, and s is a space length between codewords, the data modulation method comprising:
generating codewords satisfying an RLL (2, 11, 8, 27, 3) code;
removing codewords having a run length of 12T from the generated codewords, where T is a reproduction clock signal; and
creating a codeword table of the remaining codewords.

8. The data modulation method of claim 7, further comprising:
discarding the codewords from the codeword table with a discarding preference given to the codewords having a codeword digital sum (CDS) whose absolute value is greatest; and
arranging the remaining codewords in ascending order of the absolute value of the CDS to reduce a direct current (DC) component of the codewords.

9. A method of correcting data after the data has been written to an optical storage medium with a run length limited (RLL) modulation code expressed as RLL (d, k, m, n, s), where d is minimum run length, k is maximum run length, m is a data bit length before modulation, n is a codeword bit length after modulation, s is a space length between codewords and using prescribed RLL coding rules, the method comprising:
counting run lengths of code sequences read from the optical storage medium by detecting bit transitions in the code sequences, and if an N-th pit that does not comply with the prescribed RLL coding rules is detected, checking the run lengths of following M pits; and
if the run length of any of the following M pits does not comply with the prescribed RLL coding rules, correcting the run length of the N-th pit according to the prescribed RLL coding rules.

10. The method of claim 9, further comprising:
if the run length of the N-th pit is s/2 less than a run length of the RLL code, correcting the N-th pit by adding s/2 to the run length of the N-th pit; and
correcting the (N+1)th pit by subtracting s/2 from the run length of the (N+1)th pit.

11. The method of claim 9, further comprising:
if the run length of the N-th pit is s/2 greater than a run length of the RLL code, correcting the N-th pit by subtracting s/2 from the run length of the N-th pit; and
correcting the (N+1)th pit by adding s/2 to the run length of the (N+1)th pit.

12. The method of claim 9, wherein, when s=3, if the run length of the N-th pit is 1 less than a run length of the RLL code, the N-th pit is corrected by adding 1 to the run length of the N-th pit and the (N+1)th pit is corrected by subtracting 1 from the run length of the (N+1)th pit.

13. The method of claim 9, wherein, when s=3, if the run length of the N-th pit is 1 greater than a run length of the RLL code, the N-th pit is corrected by subtracting 1 from the run length of the N-th pit and the (N+1)th pit is corrected by adding 1 to the run length of the (N+1)th pit.

14. A method of correcting data after the data has been written to an optical storage medium with a run length limited (RLL) modulation code expressed as RLL (d, k, m, n, s) with d=2 and s=3, where d is minimum run length, k is maximum run length, m is the data bit length before modulation, n is the codeword bit length after modulation, s is the space length between codewords and using prescribed RLL modulation rules, the method comprising:

counting run lengths of code sequences read from the optical storage medium by detecting bit transitions, determining whether the counted run lengths comply with the prescribed RLL modulation rules expressing run lengths as $i_{n+1}=i_n+3$ (n=1, 2, ...) with an initial run length of $i_1=2$, and if an N-th pit which does not equal to any of the run lengths $i_n$ is detected, checking the run lengths of the following M pits; and if the run length of at least one of the M pits is not equal to the run lengths $i_n$, correcting the run length of the N-th pit according to the prescribed RLL modulation rules.

15. The method of claim 14, further comprising:

correcting the run length of the N-th pit by adding a value to or subtracting a value from the run length of the N-th pit such that the run length of the N-th pit is equal to one of the run lengths in that has an absolute value closest to the run length of the N-th pit; and correcting the run length of the (N+1)th pit by subtracting from or adding to the run length of the N-th pit the value which is added or subtracted to the N-th pit.

16. A method of correcting data after the data has been written to an optical storage medium with a run length limited (RLL) modulation code expressed as RLL (d, k, m, n, s) with d=1 and s=3, where d is minimum run length, k is maximum run length, m is a data bit length before modulation, n is a codeword bit length after modulation, and s is a space length between codewords and using prescribed RLL modulation rules, the method comprising:

counting run lengths of code sequences read from the optical storage medium by detecting bit transitions, determining whether the counted run lengths comply with the prescribed RLL modulation rules expressing run lengths as $i_{n+1}=i_n+3$ (n=1, 2, ...) with an initial run length of $i_1=1$, and if an N-th pit which does not equal any of the run lengths $i_n$ is detected, checking the run lengths of the following M pits; and if a run length of at least one of the M pits is not equal to the run lengths $i_n$, correcting a run length of the N-th pit to comply with the prescribed RLL modulation rules.

17. The method of claim 16, further comprising:

correcting the run length of the N-th pit by adding a value to or subtracting a value from the run length of the N-th pit such that the run length of the N-th pit is equal to one of the run lengths $i_n$ that has an absolute value closest to the run length of the N-th pit; and correcting the run length of the (N+1)th pit by subtracting from or adding to the run length of the N-th pit the value which is added or subtracted to the N-th pit.

18. A data modulation method to write data to an optical storage medium, comprising:

generating codewords by encoding data using an extended space run length limited (ES RLL) modulation expressed as RLL (d, k, m, n, s), where d is minimum run length, k is maximum run length, m is a data bit length before modulation, n is a codeword bit length after modulation, s is a space length between the codewords, s being equal to or greater than 2 and modulation rules specifying run lengths as $i_{n+1}=i_n+s$ (n=1, 2, ...) with an initial run length of $i_1=d$.

19. The data modulation method of claim 18, wherein the ES RLL modulation is applied to write and store management information of the data on the optical storage medium.

20. The data modulation method of claim 19, wherein the ES RLL modulation is pre-formed as pits in the optical storage medium and the management information comprises copyright information.

21. The data modulation method of claim 19, wherein the management information comprises address information of a physical sector of the optical storage medium, the address information used to access the data written on the optical storage medium.

22. The data modulation method of claim 18, wherein the codewords satisfy an ES RLL (2, 11, 8, 27, 3) code and the modulation rules further specify that a number of lead zeros of each codeword is one of 1, 4, and 7, and a number of end zeros of each codeword is one of 1 and 4.

23. The data modulation method of claim 18, further comprising:

discarding the codewords having a maximum run length.

24. The data modulation method of claim 23, wherein the codewords are generated satisfying an ES RLL (2, 11, 8, 27, 3) code and the data modulation method further comprises discarding the codewords having a maximum run length of 12T from the generated codewords, where T is a reproduction clock signal.

25. A method of correcting data after the data has been written to an optical storage medium, the method comprising:

generating codewords by encoding data using an extended space run length limited (ES RLL) modulation expressed as RLL (d, k, m, n, s), where d is minimum run length, k is maximum run length, m is a data bit length before modulation, n is a codeword bit length after modulation, s is a space length between the codewords, s being equal to or greater than 2 and using modulation rules expressing run lengths as $i_{n+1}=i_n+s$ (n=1, 2, ...) with an initial run length of $i_1=d$;

writing the codewords to the optical storage medium;

reading the codewords from the optical storage medium;

counting the run lengths of code sequences read from the optical storage medium by detecting bit transitions, determining whether the counted run lengths comply with the modulation rules, and if an N-th pit which does not equal to any of the run lengths $i_n$ is detected, checking the run lengths of the following M pits; and if the run length of at least one of the M pits is not equal to the run lengths $i_n$, correcting the run length of the N-th pit according to the modulation rules.

26. The method of claim 25, further comprising:

correcting the run length of the N-th pit by adding a value to or subtracting a value from the run length of the N-th pit such that the run length of the N-th pit is equal to one of the run lengths in that has an absolute value closest to the run length of the N-th pit; and correcting the run length of the (N+1)th pit by subtracting from or adding to the run length of the N-th pit the value which is added or subtracted to the N-th pit.

* * * * *

UNITED STATES PATENT AND TRADEMARK OFFICE
CERTIFICATE OF CORRECTION

PATENT NO.    : 6,600,431 B1  
DATED         : July 29, 2003  
INVENTOR(S)   : Jae-seong Shim et al.

It is certified that error appears in the above-identified patent and that said Letters Patent is hereby corrected as shown below:

Column 11,
Line 29, change "in" to -- $i_n$ --.

Column 12,
Line 60, change "in" to -- $i_n$ --.

Signed and Sealed this

Ninth Day of December, 2003

JAMES E. ROGAN
*Director of the United States Patent and Trademark Office*